United States Patent [19]

Hiyoshi et al.

[11] Patent Number: 5,610,439
[45] Date of Patent: Mar. 11, 1997

[54] PRESS-CONTACT TYPE SEMICONDUCTOR DEVICES

[75] Inventors: Michiaki Hiyoshi; Hisayoshi Muramatsu; Takashi Fujiwara, all of Yokohama, Japan

[73] Assignee: Kabushiki Kaisha Toshiba, Kawasaki, Japan

[21] Appl. No.: 526,320

[22] Filed: Sep. 11, 1995

[30] Foreign Application Priority Data

Sep. 15, 1994 [JP] Japan .................................. 6-246927

[51] Int. Cl.⁶ .................................................. H01L 23/48
[52] U.S. Cl. ........................... 257/688; 257/723; 257/788
[58] Field of Search ................................. 257/785, 688, 257/723

[56] References Cited

U.S. PATENT DOCUMENTS 4,647,959  3/1987  Smith ........................................ 257/785
5,250,821 10/1993  Ferla et al. ............................... 257/688
5,267,867 12/1993  Agahdel et al. .

FOREIGN PATENT DOCUMENTS 0064383  11/1982  European Pat. Off. .
0476661   3/1992  European Pat. Off. .
4-137561  5/1992  Japan .

Primary Examiner—Sara W. Crane
Assistant Examiner—Roy Potter
Attorney, Agent, or Firm—Oblon, Spivak, McClelland, Maier & Neustadt, P.C.

[57] ABSTRACT

A press-contact type semiconductor device having multiple semiconductor substrates, a periphery of which being enclosed by a chip frame of insulating resin a first electrode plate and a second electrode plate. The semiconductor substrates are arranged on a plane so as to abut against the chip frame. The semiconductor substrates are press-contacted from the upper and the lower sides by the first electrode plate and the second electrode plate.

21 Claims, 14 Drawing Sheets

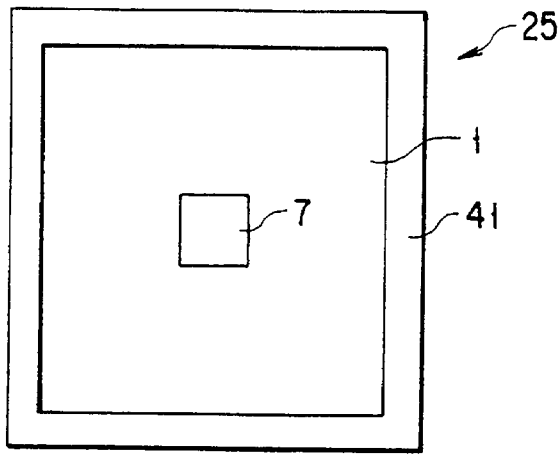
F I G. 8A
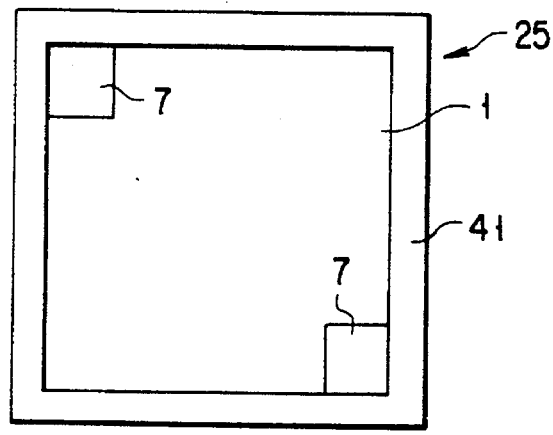
F I G. 8B
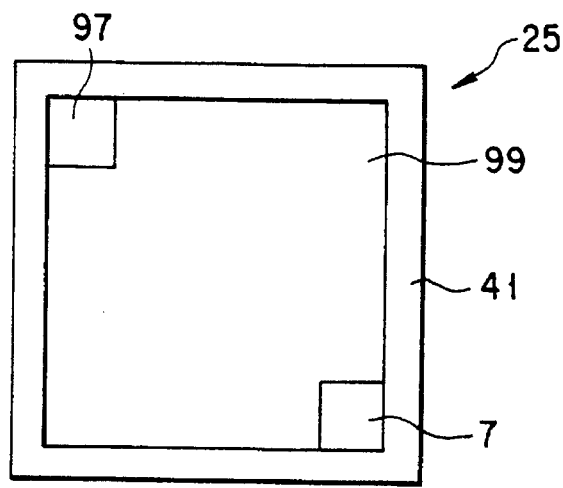
F I G. 8C

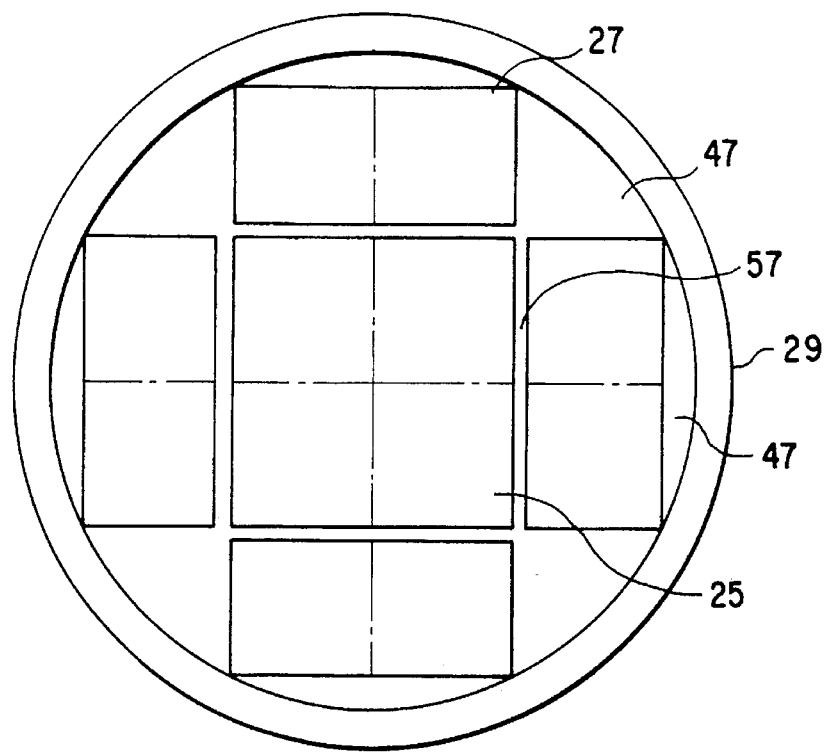
F I G. 9
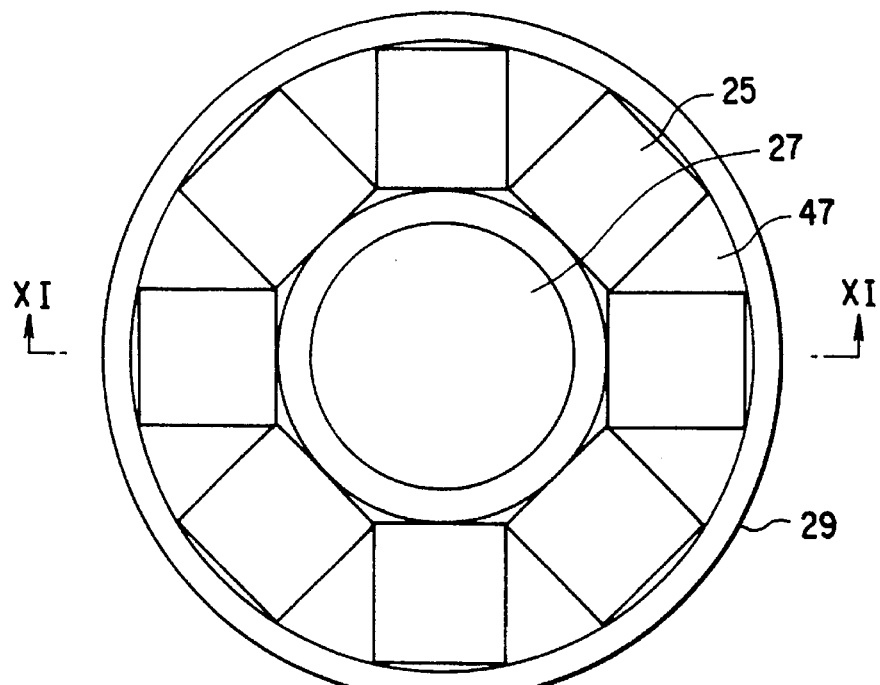
F I G. 10

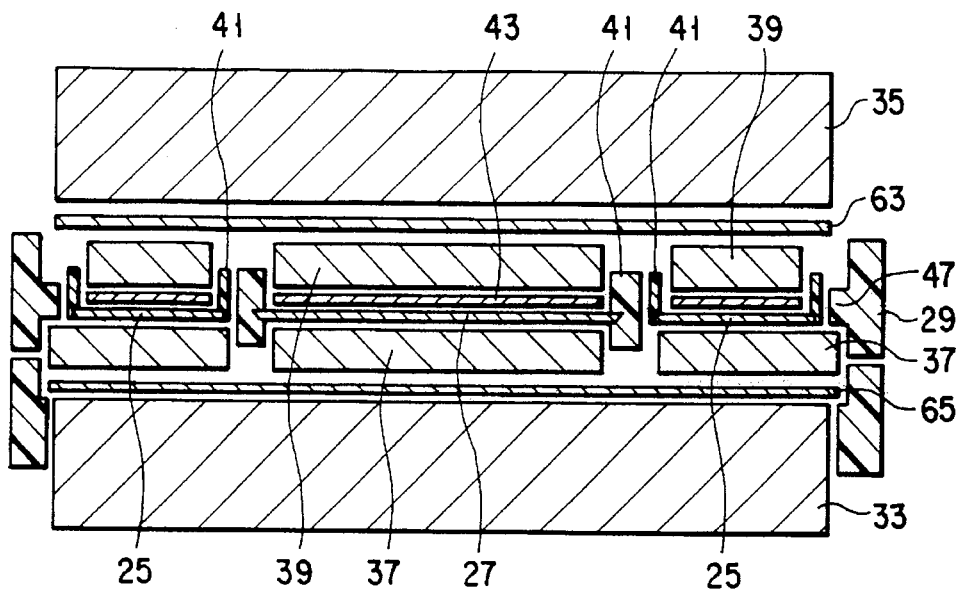
F I G. 11
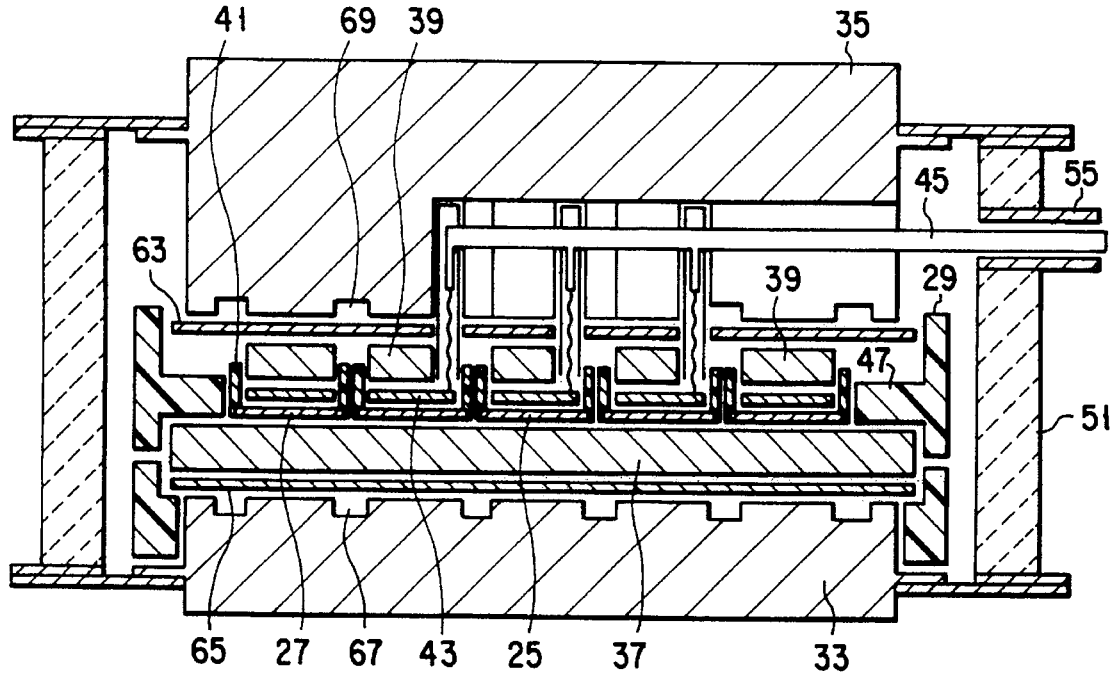
F I G. 12

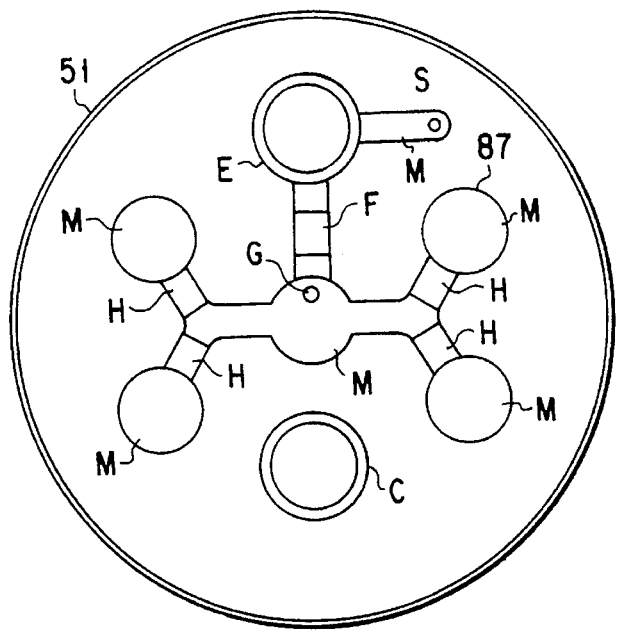
F I G. 20
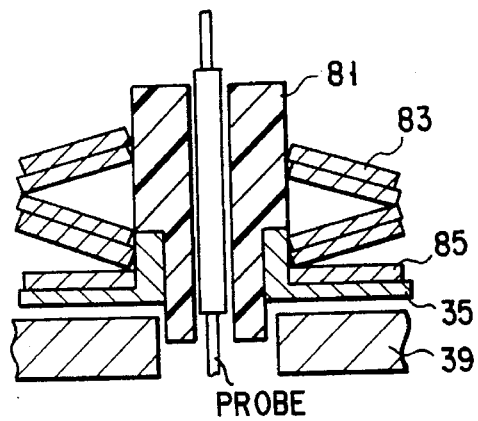
F I G. 21
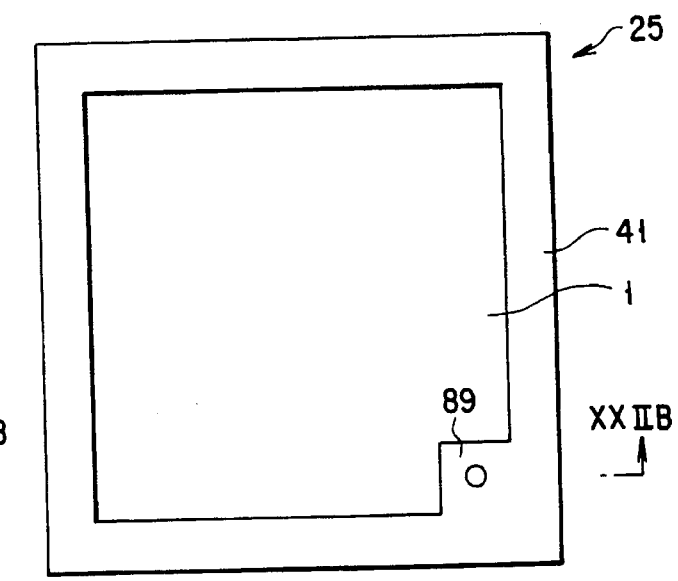
F I G. 22A
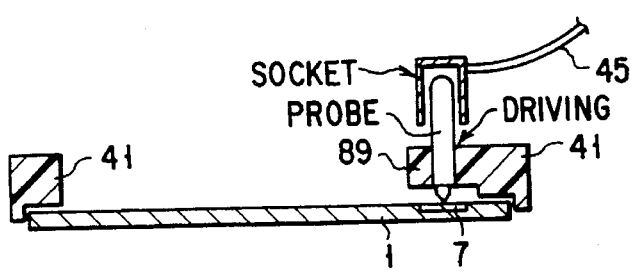
F I G. 22B

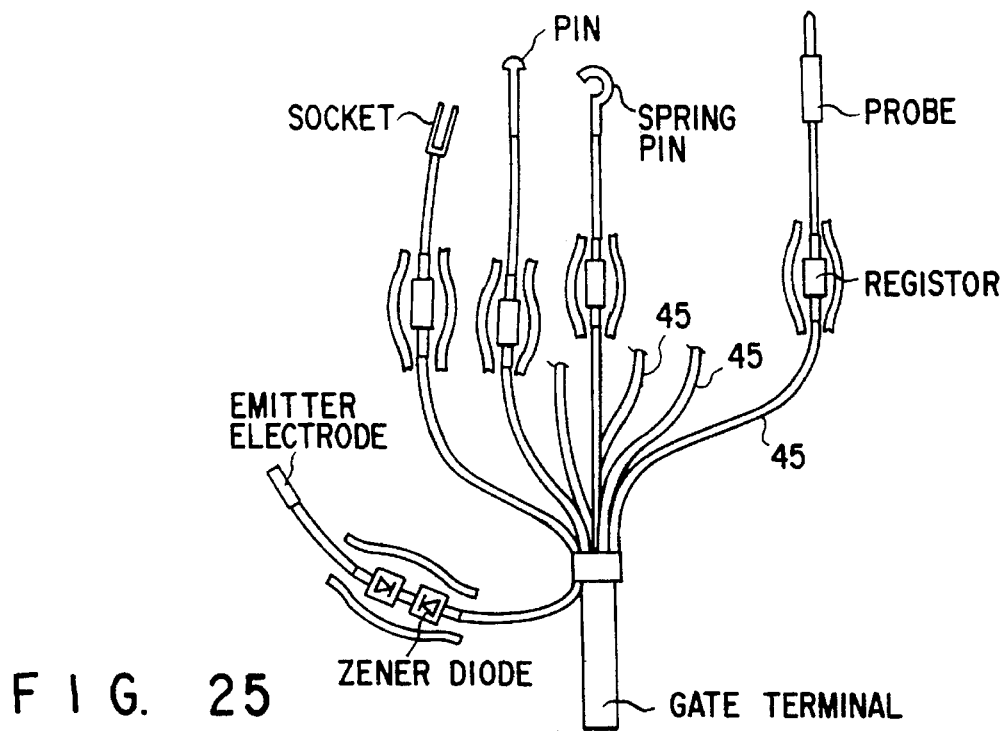
FIG. 25
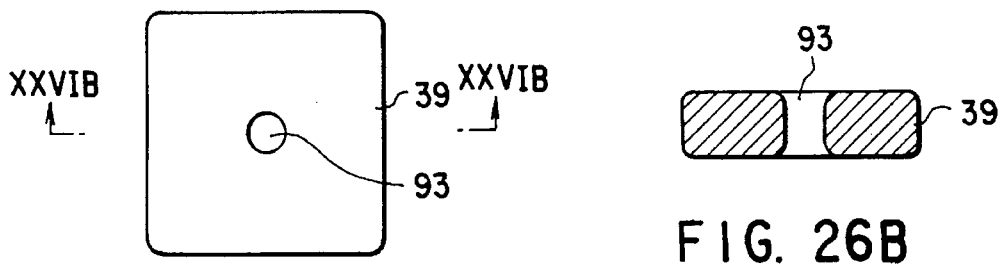
FIG. 26A
FIG. 26B
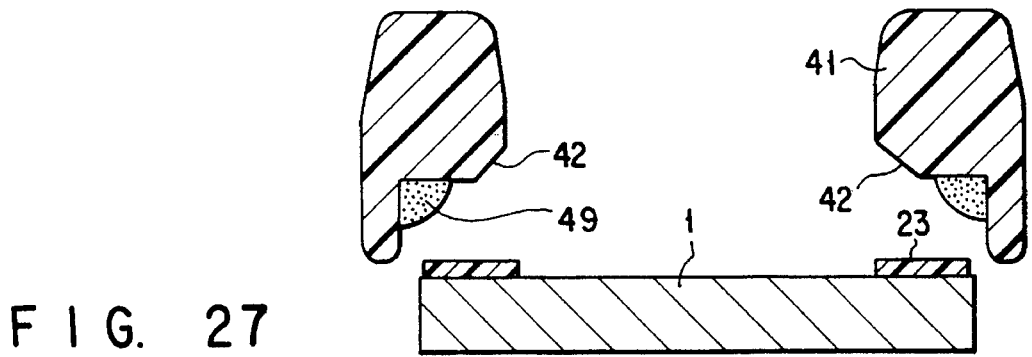
FIG. 27

PRESS-CONTACT TYPE SEMICONDUCTOR DEVICES

BACKGROUND OF THE INVENTION

1. Field of the Invention

The present invention relates to a press-contact type semiconductor device, more particularly, relates to MOS gate drive switching devices such as IGBT (Insulated Gate Bipolar Transistor) having a plurality of semiconductor substrates.

2. Description of the Related Art

Conventionally, the structure of the press-contact type semiconductor device has been only one which press-contacts a single semiconductor substrate (hereinafter referred to as "chip"). For example, in the press-contact type device of the anode short type GTO (Gate Turn-Off) thyristor, the disc type chip includes N-type emitter layer, P-type base layer, N-type base layer and P-type emitter layer, from the chip surface which is the cathode toward the back face of the chip which is the anode.

N-type emitter region on the chip surface is formed as a plurality of mesas on P-type base layer. These N-type emitter regions has an aluminum cathode electrode on the top portion of said mesas, and a plurality of gate electrodes composed of aluminum are provided in P-type base layer exposed by said mesa processing. On the back face of the chip, a plurality of P-type emitter regions having a planar structure are formed within the surface of a flat N-type base layer, and the anode short type GTO thyristor is formed by providing the anode electrode composed of aluminum on the whole face thereof, extending over said N-type base layer and P-type emitter regions. The side face of the chip is coated with, for example, silicone resin for the insulation protection.

On the cathode electrode of the top portion of said mesas, the cathode external electrode is press-contacted, and on the anode electrode, the anode external electrode is press-contacted. The above-mentioned press-contact type device of the anode short type GTO thyristor is disclosed in KOUKAI, "Press-contact type semiconductor device", HEI, 4-137561 (12 May, 1992).

Recently, IGBT has appeared as a MOS gate drive type switching device. This device is characterized in that it has an advantage that it makes high voltage and high current operation easy, which the bipolar transistor has, and an advantage that driving is easy. As the switching device using this IGBT, a RC (Reverse Conduction) type switching device incorporating FRD (Free Wheel Diode) is known. This device is the one which connects FRD to IGBT in inversely parallel, and used in a module structure. This module is assembled by forming an electrode pattern used as given collector electrode, emitter electrode, emitter control electrode and gate electrode on the insulation substrate, and by solder mounting a plurality of IGBT back-face collectors and FRD chips, respectively, on said collector electrode pattern. The emitter on the upper face of the chip, emitter control and respective electrodes of the gate, and the corresponding electrode patterns on the insulation substrate are connected by a bonding wire, respectively.

The surface of IGBT chip mounted on the switching device of this module structure is coated with a passivation film such as polyimide, except for the bonding pad of the gate and emitter. The square shaped silicon chip of IGBT forms the collector electrode of the metal multilayer film over the whole surface of the back face of the chip in order to facilitate soldering.

For example, since the press-contact type semiconductor device composed of the conventional GTO thyristor has only one structure to press-contact one chip, there are defects described below:

(1) High current operation of the element is difficult. Namely, in order to increase the current rating of the element, it has been necessary to make the chip size large. However, if the chip size is increased, such problems are caused that in the high-speed power element such as MOS gate type switching devices of IGBT, the possibility to contain unrestorable defects which make fine processing difficult is increased to increase the failure rate.

(2) Highly functionalizing and high value-adding are difficult. For example, when RC type IGBT device is produced, two different kinds of device structures, IGBT and FRD have to be produced in one wafer, thereby the production process is complicated and production becomes difficult.

Furthermore, when the conventional module type semiconductor device is used to be mounted on a vehicle (for traction applications), such problems described below are caused:

(1) Reliability for the Power Cycle of Bonding

It is required that semiconductor devices for traction applications have to be endurable to the power cycle of 6 million cycles at a temperature variation of 25° C., but in the current technology, it can only endure 3 million cycles.

(2) Reliability for the Thermal Fatigue of the Soldering Layer

It is required that the soldering layer has to be endurable, as in said bonding, to the power cycle of 75,000 cycles at a temperature variation of 70° C., but in the current technology, it can only endure about 25,000 cycles.

(3) Reliability for Cooling of the Element

Conventional module type semiconductor devices are cooled on the only one face from the collector side, and cooling from the emitter electrode side is almost impossible. Therefore, in order to enhance the heat dissipation, the outside diameter of the element has to be increased. For example, in the RC type IGBT module of 1200 A–2500 V class, the outside diameter becomes 130×260×40 mm.

(4) Reliability for High Temperature Operation

In semiconductor devices for traction applications, the operating temperature in use is had to be insured in the range –40° C. –150° C., but the resin of the case material is not endurable against such temperature.

(5) Reliability for High Voltage Operation

Since the case material is a resin and easy to cause tracking, it is not endurable against high voltage operation.

(6) Reliability for Wiring

Since wiring within the module is fine and complicated, there are such problems as noise generation in the gate circuit due to the wiring inductance, and generation of the spike voltage at the time of diode recovery.

SUMMARY OF THE INVENTION

The present invention has been completed under this background. It is therefore the object of the present invention to provide MOS gate drive type, planar switching devices having high reliability and suitable for traction and industrial applications, by giving a press-contact structure to the multi-chip type device.

The present invention is characterized in that a chip frame made of a synthetic resin is mounted to each periphery of multiple semiconductor chips containing MOS gate drive type chips, each chip is arranged on the same plane so as to abut against the chip frame thereof, and these are press-contacted and secured by the first electrode plate and the second electrode plate. Furthermore, by regulating the outer periphery of the arranged multiple semiconductor chips using the external frame inserted between the first electrode plate and the second electrode plate, each chip is positioned.

Namely, the press-contact type semiconductor devices of the present invention include multiple semiconductor chips (hereinafter referred to as "semiconductor substrate"), the periphery of which being enclosed by the chip frame of insulating resin, a first electrode plate and a second electrode plate, the semiconductor substrate being arranged on the same plane so as to abut against the chip frame with each other, wherein the semiconductor substrate arranged on the same plane is press-contacted from the upper and the lower sides by the first electrode plate and the second electrode plate.

Furthermore, it may be so constituted that between the first electrode plate and the second electrode plate, an external frame of insulating resin is mounted such that this external frame has a circular body enclosing the side faces of the first and second electrode plates, and a projection spreading from the inner wall to the inside of this circular body (for example, see 47 in FIGS. 1 and 2), the multiple semiconductor substrates arranged on the same plane being enclosed by this projection to make the chip frames abut with each other, subsequently being press-contacted by the first and second electrode plates.

Between the first electrode plate or second electrode plate, or the first and second electrode plates, and the semiconductor substrate, a thermal buffer plate may be intervened. Or, a thickness adjusting plate composed of a soft metal sheet may be intervened so as to abut against the press-contact plane of the first electrode plate or second electrode plate, or the first and second electrode plates. On the press-contact plane of the first electrode plate or second electrode plate, or the first and second electrode plates, a trench may be formed in the periphery of the predetermined portion opposite to the semiconductor substrate to apply the stress at the time of press-contact uniformly to the chip. Though a gate electrode contacting area is formed in a part of the emitter surface of the semiconductor substrate, the chip frame has an extending portion extending from the upper edge corner of the frame to inside thereof, the extending portion covering the gate electrode contacting area, where probes connected with the gate electrode may be provided.

The chip frame of a synthetic resin mounted to the periphery of respective chips plays a role as a positioning guide as well as protecting the insulation of the periphery, to make it possible to fix the chips and the press-contact plate at a minimum size. The external frame enclosing the outer periphery of the chip frame arranges the chip frames accurately, and enabling to determine the positional relation of the gate electrode accurately, and arrange the chips in high density. Moreover, the thickness-adjusting plate composed of a soft metal sheet having ductility, such as silver, which is inserted between the chip and the electrode plate enables to uniformly press-contact chips having different thickness. The thermal buffer plate releases the thermal stress of the semiconductor device, and the trench formed on the press-contact plane of the electrode plate releases the stress concentration to the chip periphery. The extending portion of the chip frame covering the contacting area of the gate electrode facilitates the connection to the contacting area of the gate lead, while protecting the contacting area.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8A is a second plan view of the semiconductor substrate;

FIG. 8B is a third plan view of the semiconductor substrate;

FIG. 8C is a fourth plan view of the semiconductor substrate;

FIG. 9 is a plan view of a modified embodiment of the semiconductor device shown in FIG. 1;

FIG. 10 is a plan view of the semiconductor device in the second embodiment of the present invention;

FIG. 11 is a sectional view of a region along the line XI—XI of FIG. 10;

FIG. 12 is a sectional view of a region in the third embodiment;

FIG. 20 is a plan view of the ceramic cap of the semiconductor device shown in FIG. 17;

FIG. 21 is a sectional view of the plate spring of the semiconductor device shown in FIG. 17;

FIG. 22A is a fifth plan view of the semiconductor substrate;

FIG. 22B is a sectional view of a region along XXIIB—XXIIB of FIG. 22A;

FIG. 25 is a view of various gate leads connected to the gate terminal of the semiconductor device of the present invention;

FIG. 26A is a plan view of the buffer plate used for the semiconductor device of the present invention;

FIG. 26B is a sectional view of a region along XXVIB—XXVIB of FIG. 26A;

FIG. 27 is a sectional view illustrating the way to mount the chip frame of the semiconductor device of the present invention;

DETAILED DESCRIPTION OF THE PREFERRED EMBODIMENTS

Embodiments of the present invention will now be described with reference to the accompanied drawings.

Figure 1:
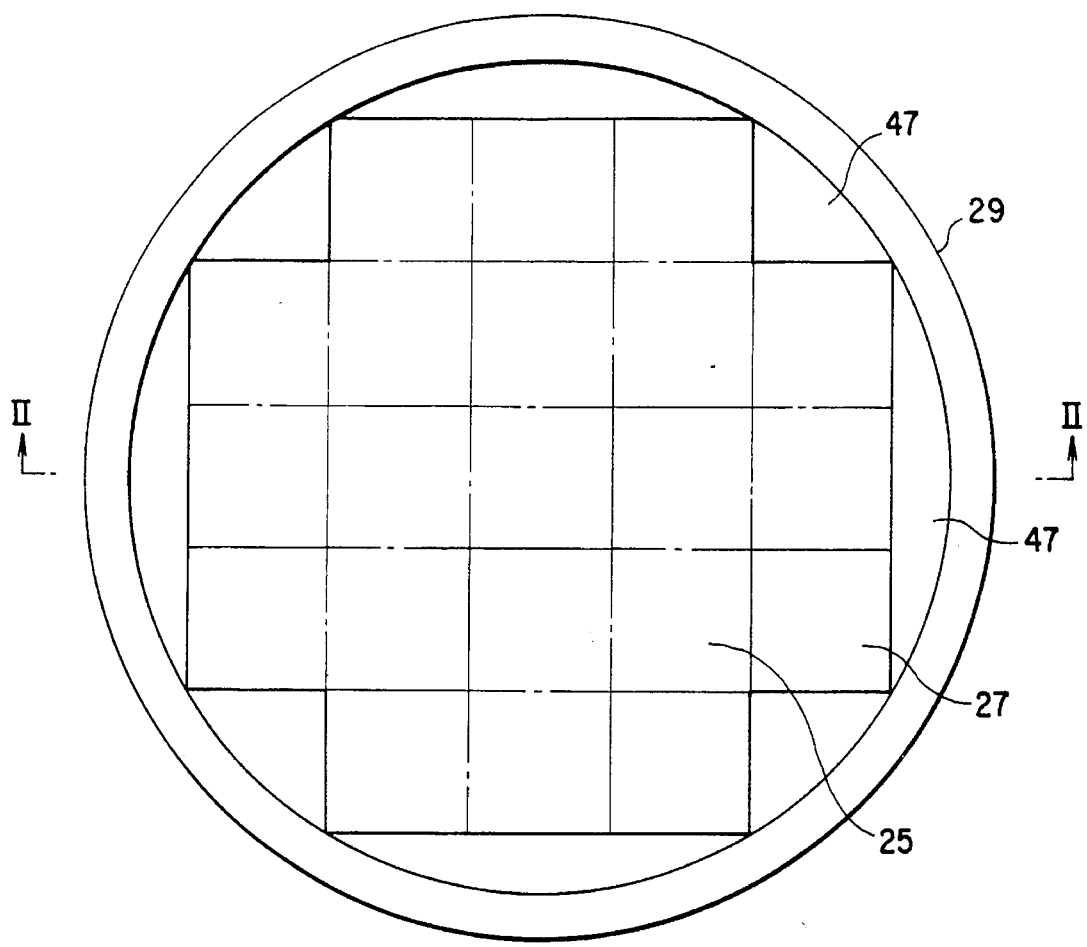
FIG. 1 is a plan view of the semiconductor device in the first embodiment of the present invention.
Figure 2:
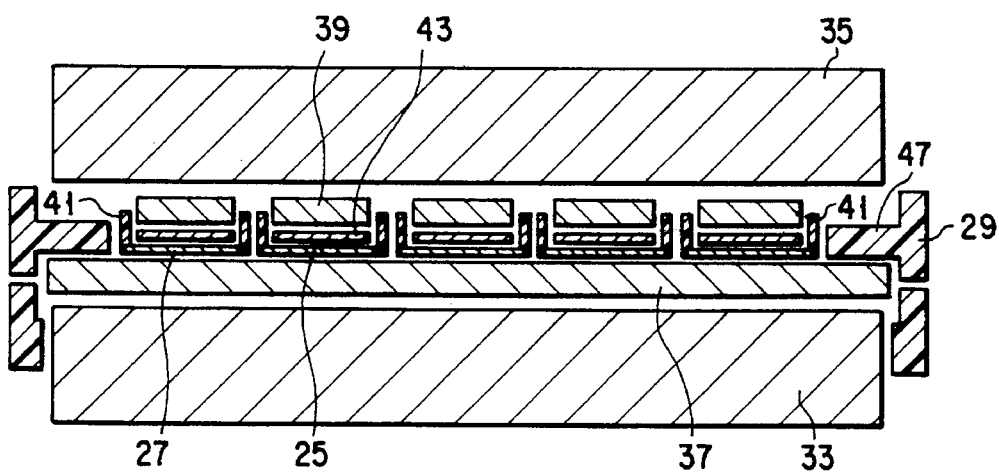
FIG. 2 is a sectional view of a region along the line II—II of FIG. 1.
Figure 3:
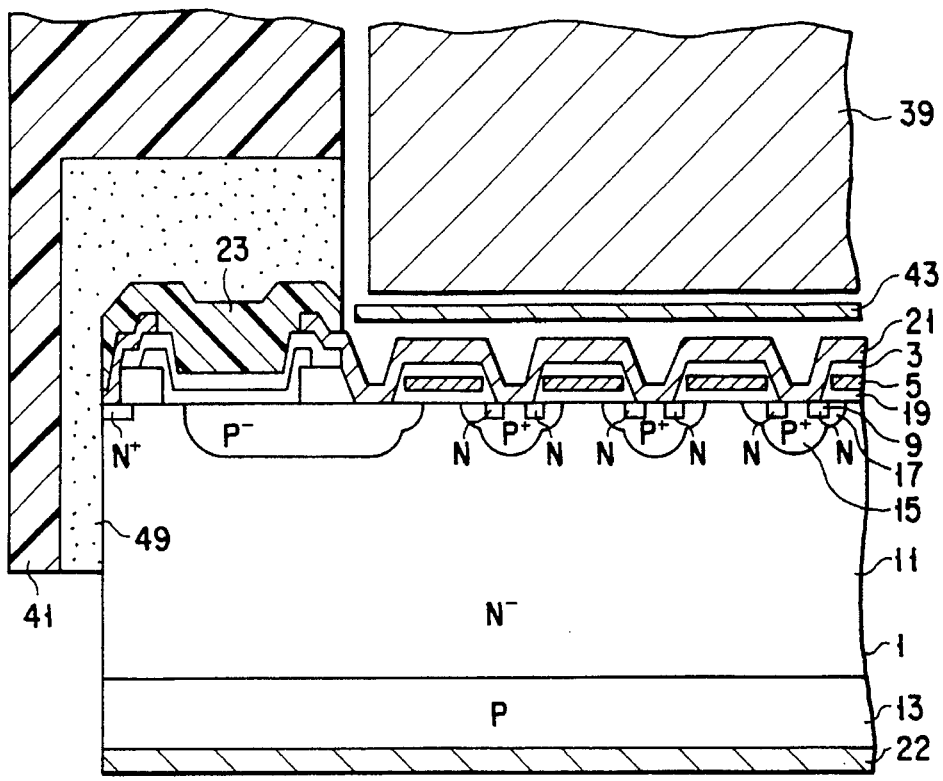
FIG. 3 is a sectional view of the peripheral region of the semiconductor substrate.
Figure 4:
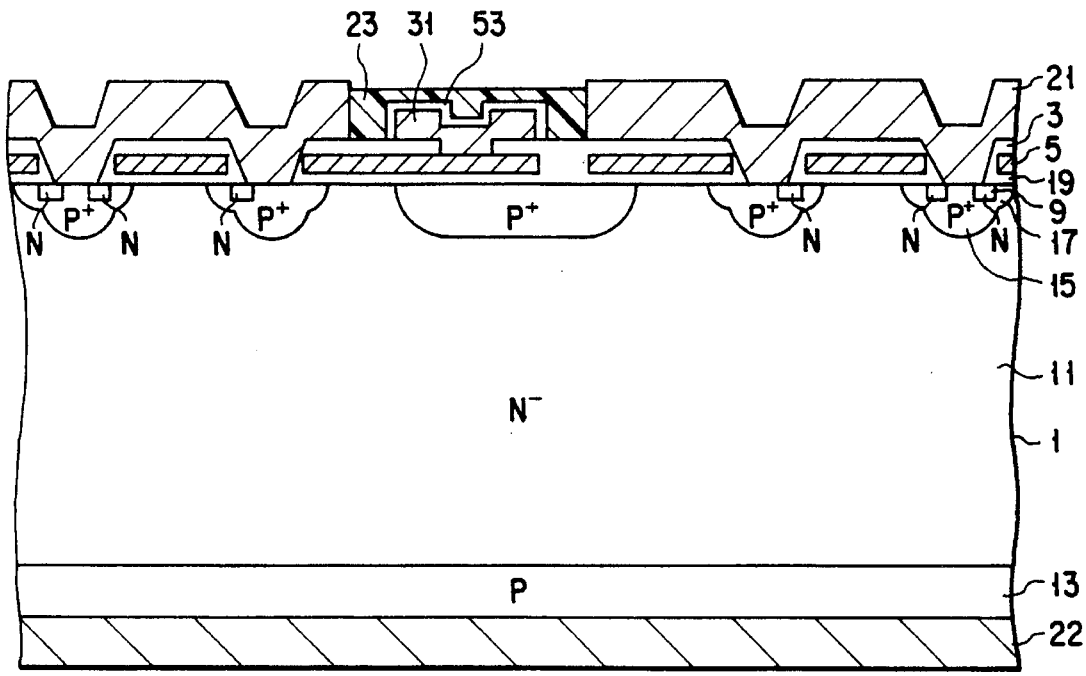
FIG. 4 is a sectional view of the central region of the semiconductor substrate.
Figure 5A:
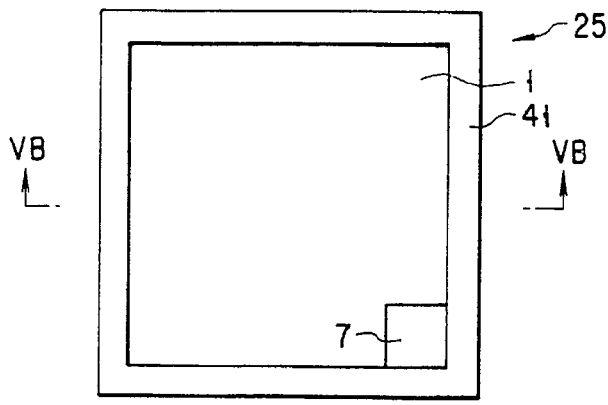
FIG. 5A is a first plan view of the semiconductor substrate.
Figure 5B:
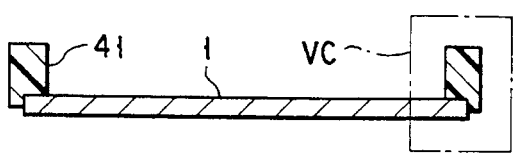
FIG. 5B is a sectional view along the line VB—VB of the semiconductor substrate.
Figure 5C:
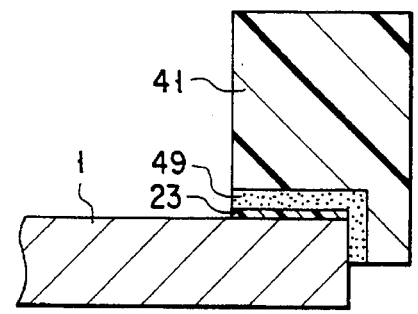
FIG. 5C is a first enlarged sectional view in the region VC of FIG. 5B.

The first embodiment will be described with reference to FIGS. 1 to 9. FIG. 1 is a schematic plan view of the press-contact type reverse conduction IGBT device, FIG. 2 is a sectional view of the region along the line II—II thereof, FIGS. 5A, 5B and 5C are a plan view and sectional views of the IGBT chip mounted with a chip frame, and FIGS. 6 to 9 are modified embodiments of respective regions of the present embodiment. As shown in FIG. 1, this device is composed of nine IGBT chips 25 in the central region and twelve FRD chips 27 in the peripheral region. Respective chips are square, but the collective body collecting them is press-contacted to the circular form. This chip collective body is enclosed by the external frame 29 which protects the outer periphery thereof and is positioned. Since the planar shape of the device of this embodiment is circular, the external frame 29 enclosing the chip collective body becomes also circular. This external frame is referred to as a ring frame. As shown in FIG. 2, this chip collective body is press-contacted by the collector electrode plate 33 which is the first electrode plate and the emitter electrode plate 35 which is the second electrode plate, but between the electrode plate and the chip, thermal buffer plates 37 and 39 composed of, for example, molybdenum are inserted.

Namely, a collector thermal buffer plate 37 is inserted between the IGBT chip 25 and FRD chip 27, and the collector electrode plate 33, and an emitter thermal buffer plate 39 is inserted between these chips 25 and 27, and the emitter electrode plate 35. Chips 25 and 27 are arranged and fixed on the collector thermal buffer plate 37. These chips are lined up leaving no space therebetween on the collector thermal buffer molybdenum plate, and fixed by the ring frame 29 which guides so as to enclose from outside. Chip frames 41 composed of silicone resin etc. are attached to the outer periphery of respective chips 25 and 27. Furthermore, between the emitter thermal buffer plate 39 and the chips 25, 27, a soft metal thin film 43 composed of, for example, copper is inserted in order to improve the contact state.

The ring frame 29 has a projection 47 extending from the inner wall to the inside, and positions chips so as to enclose the outer periphery of the arranged chip collective body. The tip of the projection 47 of the ring frame 29 abuts against the chip frame 41 on the chip periphery, and placed on the collector thermal buffer plate 37. The chip frame 41 has a function to facilitate the positioning when the chip collective body is formed, as well as to strengthen insulation of the peripheral region.

In this embodiment, the example of the press-contact type reverse conduction IGBT device provided with IGBT element having 9 chips and FRD element having 12 chips is shown, but by using the same chips and changing the numbers and the allocating ratio, devices having various ratings can be provided. As in this embodiment, by making the FRD element square with the same size with respect to IGBT element, the productivity can be improved by standardization of the chip design and the degree of freedom of the assembly technique of the chip frame can be improved. Furthermore, by making the inner wall of the chip frame 41 a guide, the emitter thermal buffer plate 39 is put on the chips 25 and 27, thereby the whole is press-contacted.

Next, with reference to FIG. 3 and FIG. 4, the IGBT chip will be described. Both figures are sectional views of the IGBT chip. The emitter surface formed on the upper face of the IGBT chip is covered with a passivation film 23 of, for example, polyimide except for the power supply region to the gate which is the control electrode and the region abutting against the emitter thermal buffer plate of the emitter electrode. This passivation film 23 is formed on the chip periphery, which means to be formed under the chip frame 41 mounted to the chip periphery. FIG. 3 shows the structure of the chip periphery and FIG. 4 shows a given section inside of the chip.

The square shaped chip 1 includes P-type collector region 13, N− base region 11, P+ base region 15, P-type base region 17, and N-type emitter region 9. P-type collector region 13 is formed on the back face of the chip 1, and on this back face, a collector electrode 22 of, for example, aluminum is formed on the whole face thereof. P+ base region 15 and P-type base region 17 are formed in N− base region 11, facing on the upper face (hereinafter referred to as "emitter surface") of the chip 1. N-type emitter region 9 is formed in P-type base region 17, facing on the emitter surface of the chip 1. Emitter electrode 21 composed of aluminum is formed on N-type emitter region 9, short-circuited to P-type base region 17. On the P-type base region 17 and the N− base region 11 sandwiched between these P-type base regions 17, a polysilicon gate 5 is formed via the gate oxide film 19. Polysilicon gate 5 is coated with an interlayer insulation film 3 such as a silicon dioxide film, and the emitter electrode 21 is disposed thereon. The gate electrode 31 connected to the polysilicon gate 5 is composed of aluminum and the like, and connected to this polysilicon gate 5 via an opening of the interlaminar film 3 (see FIG. 4).

The emitter surface of the chip 1 is coated with a passivation film 23 such as polyimide, except for the contacting area G (not shown) of the gate electrode 31 and the contacting area of the emitter electrode 21. Therefore, the region except for the contacting area G of the gate electrode 31 is coated with a passivation film 23. The gate electrode 31 is coated and protected with a silicon dioxide film 53, and the passivation film 23 is formed thereon.

Next, the way to mount the chip frame to IGBT chip 25 will be described with reference to FIGS. 5-8. FIGS. 5A-5C shows the plan view and the sectional view, and the partially enlarged view thereof of the chip having a chip frame mounted thereon. The chip 1 has a planar high voltage structure, and the shape is, for example, square. The periphery thereof is coated with a passivation film 23 of polyimide resin. On the passivation film 23 of polyimide of the periphery, a chip frame 41 comprising silicone or engineering plastics formed by a separate process in advance is adhered by an adhesive 49, such as silicone or polyimide (see FIG. 5C). This chip frame 41 and the adhesive 49 covers the upper face and side faces of the chip periphery, but does not reach to the back face collector of the chip. Furthermore, the size of the chip frame 41 is such as to keep a distance for preventing surface breakdown according to the voltage rating of the chip 1. A standard is a distance of 1 mm or longer per 1 KV. It has such a shape as to guide on the side face of the chip 1, as shown in 5C, for positioning at the time of adhering the chip frame 41 and the chip 1.

Figure 6:
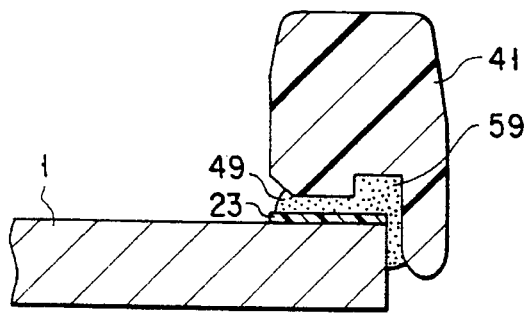
FIG. 6 is a second enlarged sectional view in the region VC of FIG. 5B.
Figure 7:
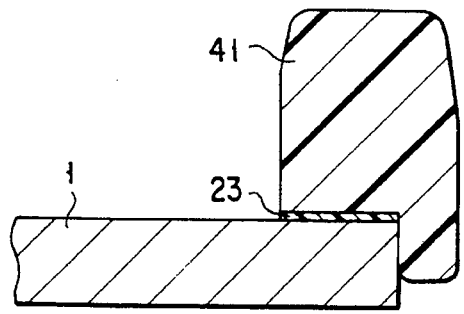
FIG. 7 is a third enlarged sectional view in the region VC of FIG. 5B.

FIG. 6 and FIG. 7 show the modified embodiment of the mounting method of the chip frame. In FIG. 6, in order to prevent a shortage of the adhesive, a trench 59 is provided on the contact plane of the chip frame 41 with the adhesive 49. Thus, the adhesive gets in the trench 59 to improve the adhesive strength. In FIG. 7, the chip frame 41 is formed integrally with the chip by using a molding technology of silicone resin and the like. Furthermore, in FIG. 6 and FIG. 7, a slightly tapered angle is provided in the upper portion of the chip frame, and each corner portion is rounded. By such finishing processing, the operation described above to arrange the chip frame by using the ring frame and to position the chip collective body can be done quite smoothly.

In FIG. 5A, the gate electrode contacting area G provided on the emitter surface of the chip 1 is shown as 7 on the chip, but in this embodiment, 7 is formed in any corner of four corners of the chip. But the position of this contacting area does not have to be restricted to the corner, and it may be formed in the central region of the chip, as shown in FIG. 8A, or may be formed more than one or two as shown in FIG. 8B. The region other than the gate electrode contacting area and the region covered with the chip frame 41 in the peripheral region becomes the contacting area of the emitter electrode, that is, the press-contact region.

FIG. 8C is a plan view of the IGBT chip used in another example. On the emitter surface, said emitter control electrode 97 is formed at the corner region of the chip, as well as the contacting area 7 of the gate electrode. The emitter control electrode 97 is insulated with the main emitter electrode 99 on the chip. The emitter control electrode 97 is provided for detecting the overcurrent and designed in such an area ratio that minute current (in the order of 10 mA–1 A) is given with respect to the main emitter electrode 99.

FIG. 9 is a modification of the ring frame in this embodiment. In the embodiment shown in FIG. 1, the external frame 29 (the circular ring frame in this embodiment) is composed of the ring portion constituting the outer periphery and the projection 47 extending from the inner wall of the ring portion toward the inside, but a lattice 57 connected integrally to the projection 47 may be formed inside of the ring frame. When the number of chips becomes large and the sum of each dimensional tolerance comes off the positioning accuracy, adequate introduction of such lattice can help the positioning operation of the chip collective body to obtain the best effect.

Next, the second embodiment will be described with reference to FIGS. 10 and 11.

FIG. 10 is a plan view of the second embodiment of the press-contact type reverse conduction IGBT device, and FIG. 11 is a sectional view of the region along the line XI—XI of FIG. 10. In this embodiment, a chip with a bevel structure is formed in the hybrid assembly. As shown in FIG. 10, there are arranged one circular FRD chip 27 in the bevel structure, and 8 square IGBT chips 25 in the periphery thereof. This chip collective body positions each chip of the collective body so as to enclose the outer periphery thereof, and is enclosed by a circular ring frame 29 which protects the periphery thereof. The chip collective body is press-contacted by the collector electrode plate 33 which is the first electrode plate and the emitter electrode plate 35 which is the second electrode plate as shown in FIG. 11. Between the electrode plate and the chips, thermal buffer plates 37 and 39 composed of, for example, molybdenum are inserted. Namely, a collector thermal buffer plate 37 is inserted between the IGBT chips 25 and the FRD chip 27, and the collector electrode plate 33, and between these chips 25 and 27 and the emitter electrode plate 35, emitter thermal buffer plates 39 are inserted. Chips 25 and 27 are arranged and fixed on the collector thermal buffer plate 37. Though in the first embodiment, these chips are lined up leaving no space therebetween on the collector thermal buffer plate, in this embodiment, the collector thermal buffer plate 37 is composed of a circular portion which supports the FRD chip 27 and a doughnut shaped portion which supports eight chips, and the emitter buffer plate 39 is composed of a circular plate which covers the FRD chip 27 and square eight plates which covers each IGBT chip 25.

The ring frame 29 fixes the chip collective body so as to enclose the chip collective body from outside by the projection 47 thereof. Chip frames 41 composed of silicon resin and the like are mounted to the outer periphery of respective chips 25 and 27. Furthermore, between the emitter thermal buffer plate 39 and chips 25, 27, soft metal thin film 43, such as copper and the like to improve the contact state is inserted. The projection 47 of the ring frame 29 is placed on the collector thermal buffer plate 37, with the tip thereof abutting against the chip frame in the chip periphery. The chip frame 41 has functions to strengthen the insulation of the chip periphery and to facilitate the arrangement, such as positioning at the time of forming the chip collective body.

Furthermore, in this embodiment, it is so controlled that the chips are uniformly press-contacted by using the thickness adjusting plate composed of, for example, a silver sheet. Namely, a silver sheet 63 is inserted between the emitter electrode plate 35 and the emitter thermal buffer plate 39 on the emitter side, and a silver sheet 65 is inserted between the collector electrode plate 33 and the collector thermal buffer plate 37 on the collector side. Thus, soft metal sheets are inserted on the outside of the thermal buffer plates as a thickness adjusting plate to adjust the slight difference of the thickness of the chip, soft metal sheets and the thermal buffer plates, and to perform uniform press-contact.

Next, the third embodiment will be described with reference to FIG. 12.

FIG. 12 is a sectional view of the third embodiment of the press-contact type reverse conduction IGBT device. A plurality of square shaped IGBT chips 25 and FRD chips 27 are respectively protected by the chip frames 41. The chip collective body is press-contacted by the collector electrode plate 33 which is the first electrode plate and the emitter electrode plate 35 which is the second electrode plate. Between the electrode plate and the chips, thermal buffer plates 37 and 39 composed of, for example, molybdenum are inserted. Namely, a collector thermal buffer plate 37 is inserted between the IGBT chips 25 and the FRD chips 27, and the collector electrode plate 33, and between these chips 25 and 27 and the emitter electrode plate 35, emitter thermal buffer plates 39 are inserted. Chips 25 and 27 are arranged and fixed on the collector thermal buffer plate 37. These chips are lined up leaving no space therebetween on the collector thermal buffer plate, and the emitter thermal buffer plate 39 is composed of a square shaped plate which press-contacts each chip, respectively. The ring frame 29 fixes the chip collective body so as to enclose the chip collective body from outside by the projection 47 thereof. Between the emitter thermal buffer plate 39 and chips 25, 27, soft metal thin films 43, such as copper and the like to improve the contact state are inserted. The projection 47 of the ring frame 29 is placed on the collector thermal buffer plate 37, with the tip thereof abutting against the chip frame 41 in the chip periphery. The chip frame 41 has functions to strengthen the insulation of the chip periphery and to facilitate the arrangement, such as positioning at the time of forming the chip collective body.

Furthermore, in this embodiment, it is so controlled that the chips are uniformly press-contacted by using the thickness adjusting plate composed of, for example, a silver sheet. Namely, a silver sheet 63 is inserted between the emitter electrode plate 35 and the emitter thermal buffer plate 39 on the emitter side, and a silver sheet 65 is inserted between the collector electrode plate 33 and the collector thermal buffer plate 37 on the collector side. Thus, soft metal sheets are inserted on the outside of the thermal buffer plates as a thickness adjusting plate to adjust the slight difference of the thickness of the chip, soft metal sheets and the thermal buffer plates, and to perform uniform press-contact. This buffer plate has also a function to adjust the difference of the thickness between chips, to some extent. Furthermore, in this embodiment, trenches 67 and 69 are formed on the inner surface facing to the chips of the collector electrode plate 33 and the emitter electrode plate 35. The trenches are formed so as to be located between chips, considering the size of the chip. The region facing to the chip of the emitter electrode plate enclosed with said trench has a characteristic that it is smaller than the area of the thermal buffer plate 39 intervened between the chips. Thus, it can prevent the load concentration of the IGBT chips 25 and FRD chips 27 to the chip periphery, at the time of press-contact, thereby the concentration of the stress to the chip peripheral region can be released.

To the gate electrode (not shown), a gate lead 45 is press-contacted by a spring. The one end of the gate lead 45 is guided to the outside of the outer peripheral device 51 through the metal sleeve 55 which is silver-soldered to the side wall of the cylindrical outer peripheral device 51. A seal is provided to the metal sleeve 55 to seal the chips 25 and 27 within the outer peripheral device 51.

Next, the fourth embodiment will be described with reference to FIGS. 13–16.

Figure 13:
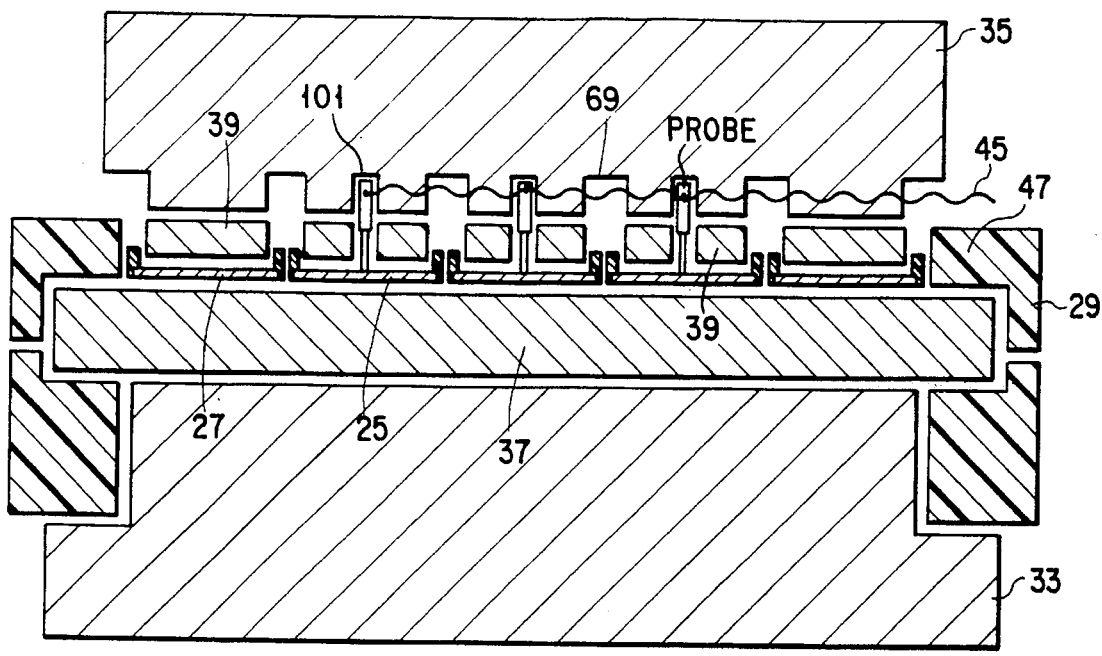
FIG. 13 is a sectional view of a region in the fourth embodiment.

Though trenches 67 and 69 are provided in the collector electrode plate 33 and the emitter electrode plate 35 in said third embodiment, in this embodiment, as shown in FIG. 13, only one trench 69 of the emitter electrode plate is provided, and the thickness of the collector thermal buffer plate 37 is largely increased. As described above, since the thermal buffer plate has also the function to adjust the difference in thickness between chips, by making it thicker, the copper thin film 43 for improving the contact state of the emitter thermal buffer plate and the chip which is required in the third embodiment, and the silver sheets 63 and 65 which adjust the thickness between the emitter and collector electrode plates and the thermal buffer plate are removed to simplify the structure of the device. In this embodiment, a gate probe mounted to the gate electrode region 101 of the trench is connected to the gate electrode contacting area 7 (see FIG. 8A) provided in the central region of the IGBT chip 25, which is guided to outside through the trench 69 by the gate lead 45 connected to the probe.

Figure 14:
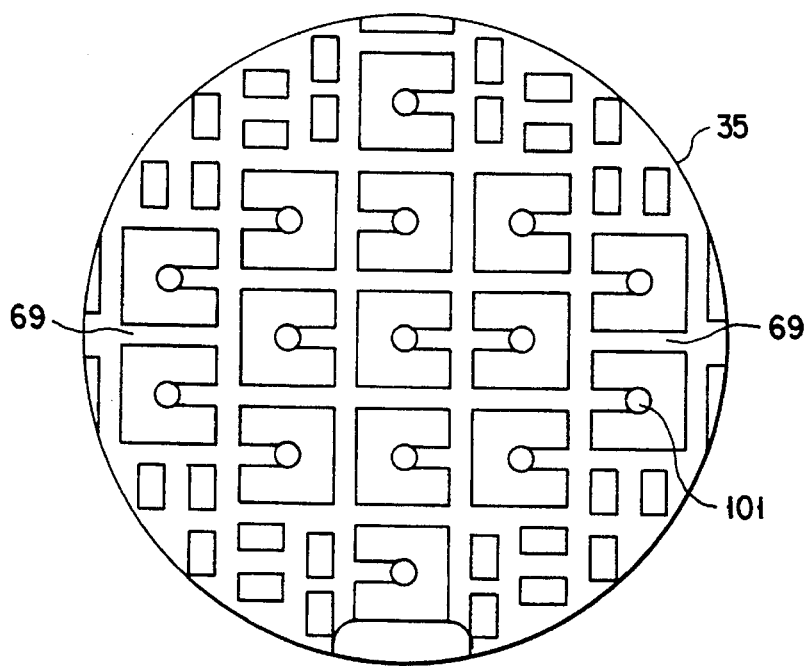
FIG. 14 is a first plan view of an emitter electrode plate.
Figure 15:
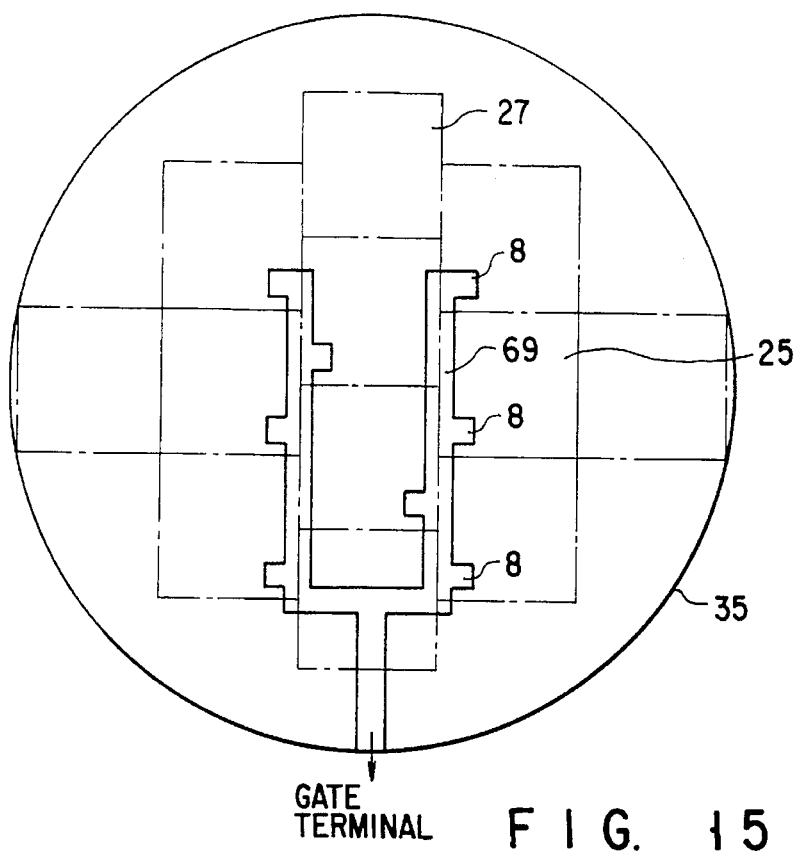
FIG. 15 is a second plan view of an emitter electrode plate.
Figure 16:
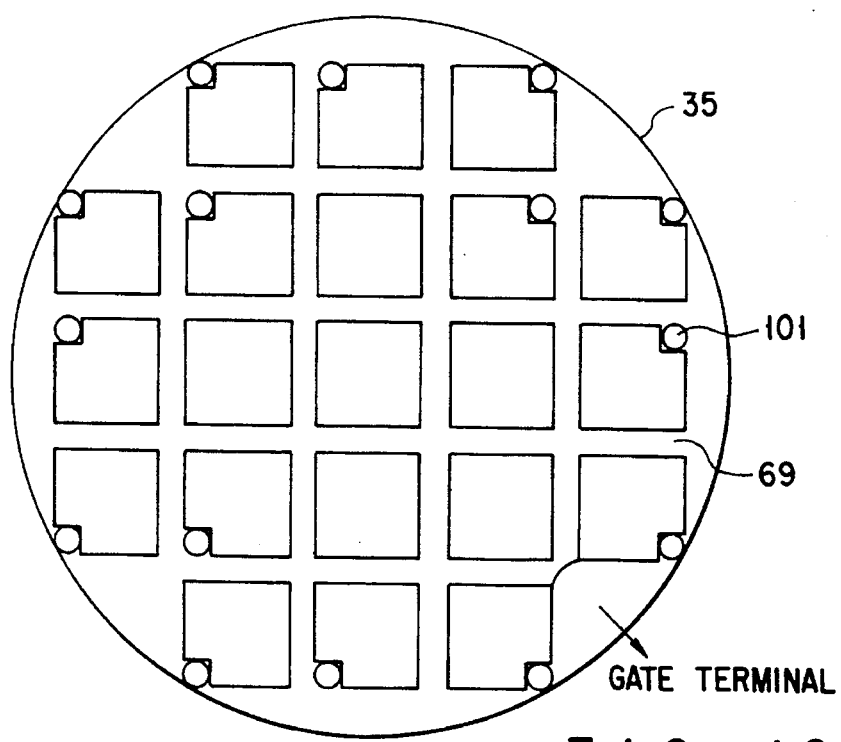
FIG. 16 is a third plan view of an emitter electrode plate.

FIGS. 14–16 are modifications of the emitter electrode plate 35 having the trenches 69. In FIG. 14, trenches 69 are formed lengthwise and crosswise on the inner surface of the emitter electrode plate, and said gate lead 45 can be set in these trenches. Also, according to need, high functionality of the device can be obtained easily by embedding other leads such as the emitter control lead and the like (see FIG. 8C), and the temperature detecting thermistor and the like. Thus, in the embodiment of FIG. 14, sufficient trenches are formed preliminarily, and only necessary ones are used for wiring of the lead. In the trenches 69, gate electrode regions 101 corresponding to the gate electrode contacting areas 7 on the IGBT chips are formed. The gate electrode regions 101 are not used with respect to FRD chips. The square shaped flat region enclosed by these trenches are used as the press-contact plane.

FIG. 15 shows the embodiment in which the trenches are formed, on the contrary, in the emitter electrode plate, only in the portions necessary for wiring of the lead and the like. If there is a necessity to arrange other leads and a thermistor, trenches for them are further formed. 8 is opposite to the gate electrode contacting area 7 on the chip. In this embodiment, as shown in FIG. 5A, a case where 7 is provided at the corner of the IGBT chip is shown.

FIG. 16 is other modification of the emitter electrode plate. As in FIG. 14, trenches 69 are formed lengthwise and crosswise on the inner surface of the emitter electrode plate, but the gate electrode region of the trench is provided at the corner of the press-contact plane to the IGBT chip, and IGBT chips are arranged in the peripheral region of the electrode plate and FRD chip is arranged in the central region thereof.

As described above, even if trenches are provided in the emitter electrode plate contributing to the heat release of the chip, the trench portions are opposite to the chip frame-forming region of the chip periphery, and it does not contribute to the heat release, therefore, it hardly gives the influence to the heat release characteristic of the whole press contact device.

The emitter electrode plate shown in FIGS. 14–16 can be applied to the third embodiment other than this embodiment.

Next, the fifth embodiment will be described with reference to FIGS. 17–21.

Figure 17:
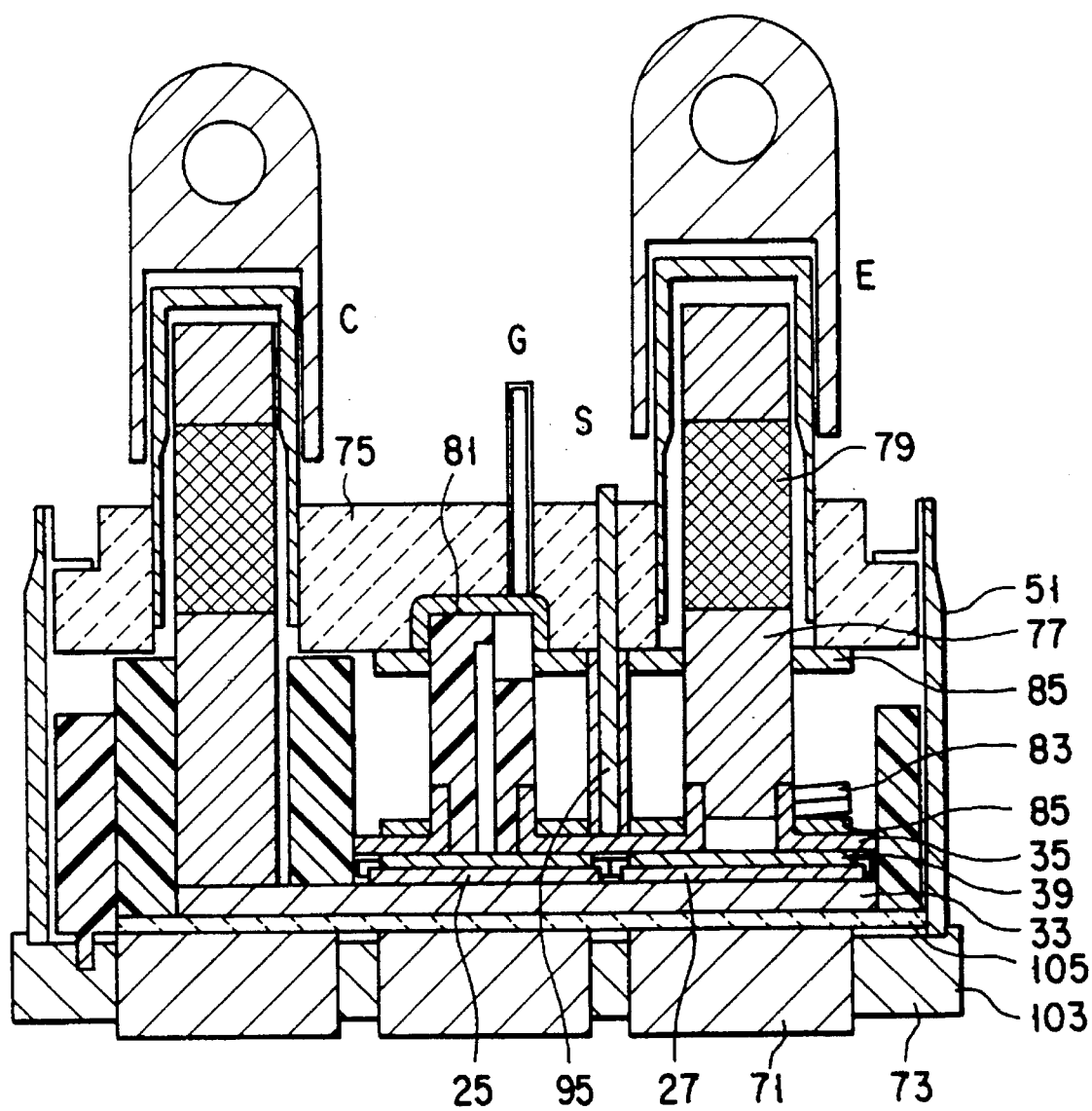
FIG. 17 is a sectional view of the semiconductor device in the fifth embodiment.
Figure 18:
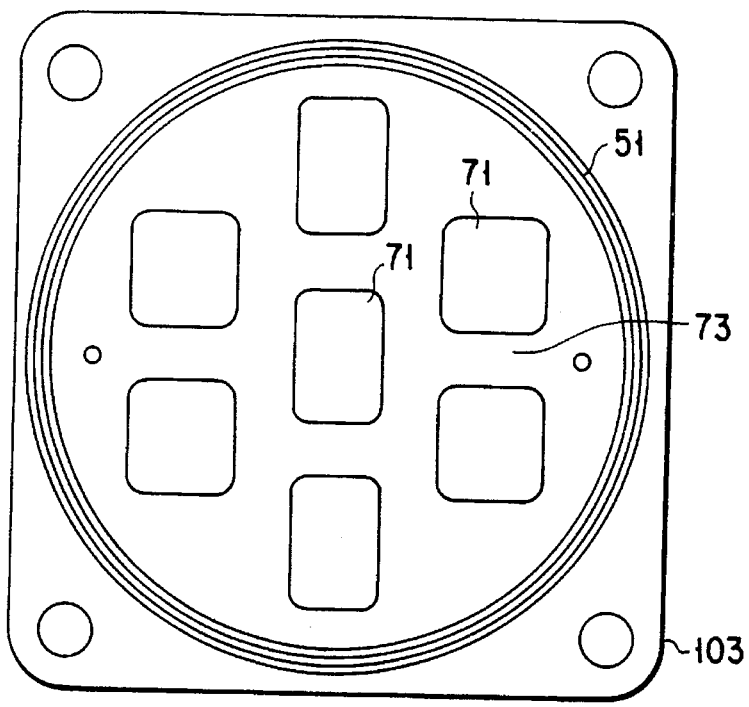
FIG. 18 is a plan view of the base of the semiconductor device shown in FIG. 17.
Figure 19:
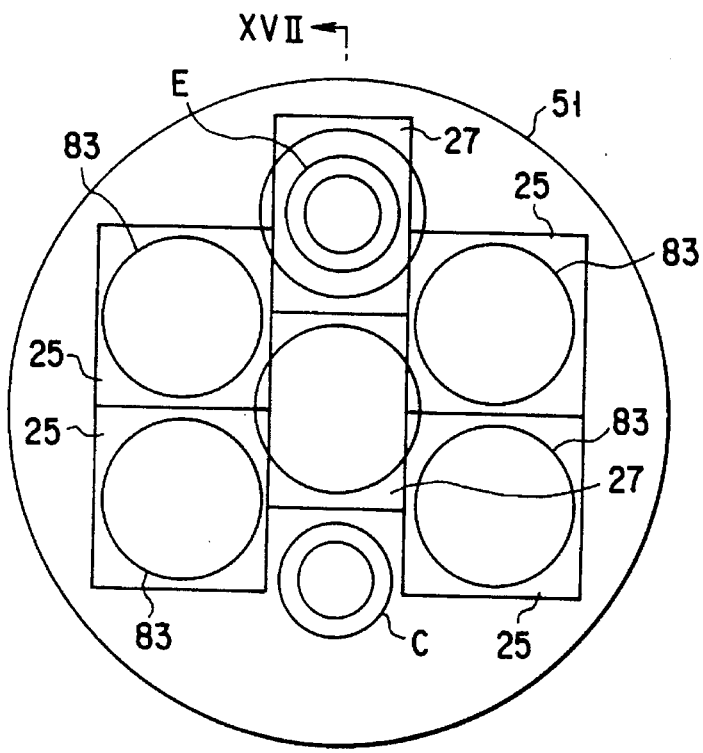
FIG. 19 is a plan view of the chip arrangement of the semiconductor device shown in FIG. 17.

FIG. 17 is a sectional view of the stud type reverse conduction IGBT semiconductor device having a rating of 600 V–800 A, FIG. 18 is a plan view of the base used for this semiconductor device, FIG. 19 is a plan view of the semiconductor device showing the arrangement of the chips, FIG. 20 is a plan view showing the inside of the ceramic cap used for the semiconductor device, and FIG. 21 is a sectional view showing the using state of the plate spring within the device.

In the semiconductor device of the present embodiment shown in FIG. 17, an insulating substrate 105 of aluminum nitride and the like is mounted to the base 103, and a collector electrode plate 33 composed of copper having a thickness of about 0.5 mm, which is the first electrode plate, is mounted to 105, and IGBT chip 25 and FRD chip 27 are placed thereon. The periphery of each chip is protected by the chip frame 41 of silicone resin and the like, as shown in FIG. 18. Buffer plates 39 of molybdenum are placed on the chips, and a common emitter electrode plate 35 having a thickness of about 0.5 mm thereon pressurizes all buffer plates 39 of the chips. A cylindrical outer peripheral device 51 placed on the base 103 encloses these chips, and is sealed by a ceramic cap 75. The emitter external electrode E, collector external electrode C, gate external electrode G and emitter control external electrode S of this semiconductor device are supported by the ceramic cap 75. The emitter external electrode E is connected to the emitter electrode plate 35 via the emitter electrode post 77 mounted on one chip among IGBT chips 25 and FRD chips 27 and the strand wire 79.

Both side probes or springs placed in the insulator tube 81 on the chip connect the gate external electrode G and the gate electrode formed on the surface of IGBT chips 25. Connection between gate electrodes of IGBT chips 25 is performed by using the metallized pattern formed on the inner surface of the ceramic cap 75. The emitter electrode plate 35 connects between the emitters of respective chips into one. The collector external electrode C is electrically connected to the common collector electrode plate 33. In the present embodiment, since the central chip in FIG. 17 is, as shown in the plan view of FIG. 19, a FRD chip 27, a probe is not inserted to the insulator tube shown in FIG. 17 and the insulator tube becomes hollow. The press contact to the chips by the emitter electrode plate 35 is energized by the plate spring 83 mounted on each chip via a washer 85. The emitter control external electrode S is directly connected to the emitter control electrode on the chip, via an emitter control lead 95 of a probe and the like, thereby the parasitic resistance can be reduced. In this figure, the collector external electrode C and the emitter external electrode E are connected by caulking or soldering the external trip terminal, respectively. These external trip terminals are mounted vertically, but they may be mounted horizontally.

FIG. 18 is a plan view of the base 103. The base 103 has a mounting hole, and is composed of supporting portions 71 of copper loaded with respective chips and a lattice portion 73 of iron supporting this supporting portions 71. Since copper is readily deformed, and expands outwardly due to the internal press-contact force, and thereby the press-contact force does not applied or the uniformity is harmed, the lattice 73 of iron is added to surround it, as in this embodiment, to increase the strength of the base. The supporting portion 71 of copper is disposed only under the chip. An outer peripheral device 51 is formed in the periphery of the base 103.

FIG. 19 is a plan view showing the inside of the outer peripheral device 51. And FIG. 17 is a sectional view of the region along the line XVII—XVII. The chips arranged therein are composed of four IGBT chips 25 and two FRD chips 27 in the central region. Plate springs 83 to press-contact the chip are formed on the respective chips. The emitter external electrode E is formed on one of FRD chips 27, and the collector external electrode C is formed in a given space.

FIG. 20 is a plan view showing the surface facing to the inside of the outer peripheral device 51 of the ceramic cap 75 shown in FIG. 17. A metallized pattern 87 of the gate electrode is formed on this surface. Blank portions F and H are formed in order to connect a resistor, a condenser, Zener diode and the like by soft soldering or silver soldering at some portions in the metallized pattern 87. If there is no need to attach these parts, these blank portions may be metallized. This metallized pattern 87 connects between gates of IGBT chips 25. To the blank portion F, for example, a condenser and Zener diode are connected. To the blank portion H, for example, a resistor is connected. Thus, by utilizing the inner face of the ceramic cap, high functionality of the device can be easily obtained.

FIG. 21 is an enlarged view showing the structure of the plate spring. Plate springs are attached to every chip, thereby the difference in grade of the thickness per every chip can be readily adjusted by its stroke.

Next, each structural portion or its modification used for the embodiments of the semiconductor device of the present invention will be described in detail with reference to FIGS. 22–29.

Figure 23A:
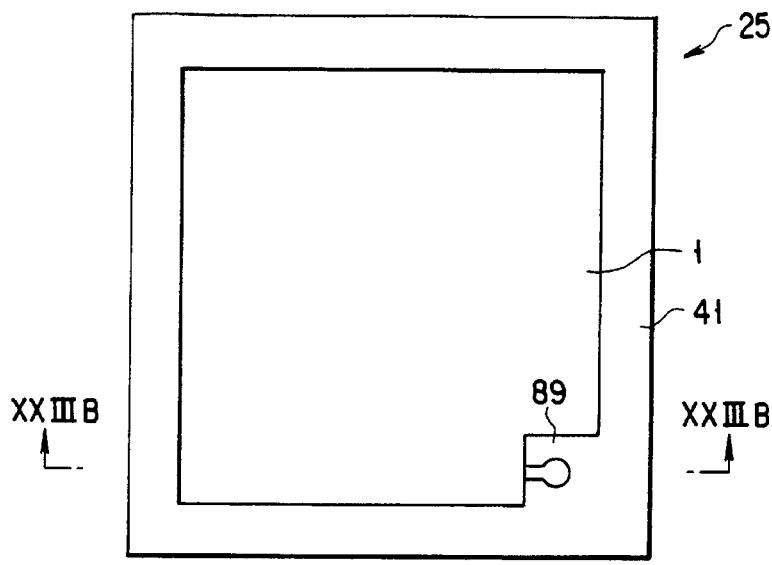
FIG. 23A is a sixth plan view of the semiconductor substrate.
Figure 23B:
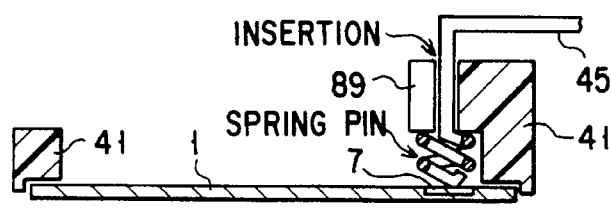
FIG. 23B is a sectional view of a region along XXIIIB—XXIIIB of FIG. 23A.
Figure 24A:
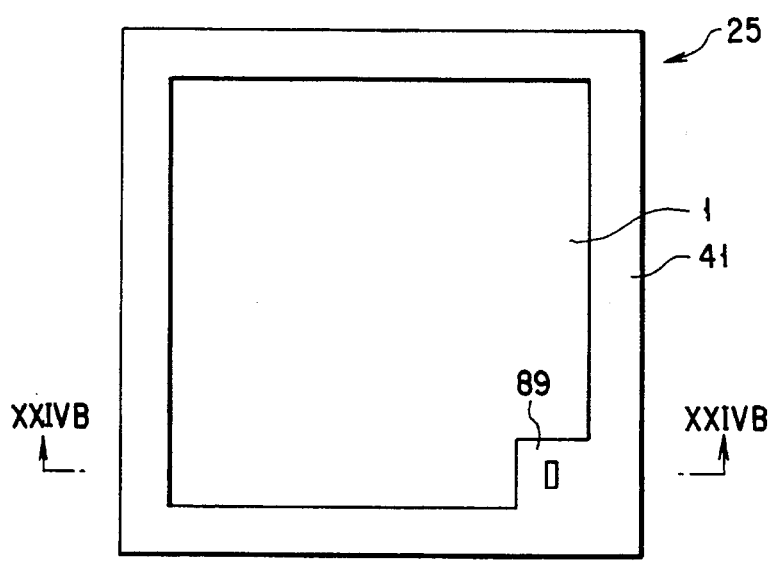
FIG. 24A is a seventh plan view of the semiconductor substrate.
Figure 24B:
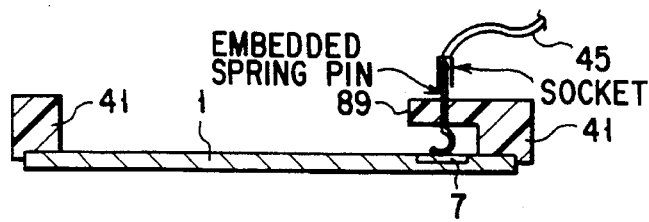
FIG. 24B is a sectional view of a region along XXIVB—XXIVB of FIG. 24A.

FIGS. 22–24 are plan views and sectional views of modifications of the chip frame mounted to the chip. In these figures, IGBT chips 25 are composed of a silicon chip 1 and a chip frame 41 which covers and protects the peripheral region of the chip. The surface of the chip 1 has a contacting area 7 of the gate electrode and a press-contact region of the emitter electrode exposed from the chip frame. In this embodiment, it is characterized in that the chip frame 41 has an extending portion 89 and this extending portion 89 covers the contacting area 7 of the gate electrode on the surface of the chip. By the existence of this extending portion 89, the chip frame 41 has a function to support the gate lead 45. FIG. 22A is a plan view when the contacting area of the tip of the gate lead comprises a socket and a probe, and FIG. 22B is a sectional view along the line XXIIB—XXIIB thereof. The tip of the probe is joined to the contacting area 7 of the gate electrode of the chip 1 through a circular breakthrough in the extending portion 89. In FIG. 23B, the contacting area of the tip of the gate lead 45 comprises a spring pin, and the gate lead 45 is fitted into the kerf in the extending portion 89, and the tip of the spring pin is joined to the contacting area 7 of the gate electrode. In FIG. 24B, the contacting area of the tip of the gate lead 45 comprises a socket and an embedded spring pin, and this spring pin is joined to the contacting area 7 of the gate electrode on the surface of the chip 1, through the breakthrough having a rectangle section in the extending portion 89 shown in FIG. 24A.

In FIG. 25 is shown collectively a structure of various gate leads 45 connecting the gate terminal G guided to the outside of the semiconductor device and the gate electrode of each IGBT chip. The gate terminal is formed by combining a plurality of gate leads 45 connected from a plurality of chips. As shown in FIG. 25, an oscillation-preventing resistor may be wired to the gate lead 45. The resistor is preferably placed in the vicinity of the chip as near as possible so as to reduce the L component. Furthermore, the resistor is covered with an insulation-coated tube. The connecting methods of the gate lead 45 and the gate electrode 7 of the chip include the methods shown in FIGS. 22–24. Furthermore, the socket is fitted to the probe, a spring pin or the like of the gate electrode. According to need, a Zener diode having a breakdown voltage of about 30 V for preventing overvoltage of the gate may be inserted between the gate and the emitter. Or, a condenser may be inserted between the gate and the emitter.

FIG. 26A is a plan view of the emitter thermal buffer plate 39 and a sectional view along the line XXVIB—XXVIB thereof. As shown in these figures, the molybdenum plate used for the emitter thermal buffer plate 39 has a thickness of about 1–2 mm, and the four corners are processed to the radius of curvature R of about 0.2–1 mm. This processing is performed by punching followed by barrel finishing, and the load concentration to the corner portions is released. Since this buffer plate 39 has a gate lead breakthrough 93 formed in the central region thereof, it is used for the IGBT chip in which the contacting area of the gate electrode is formed in the central region. Said radius of curvature R is applied to the breakthrough 93. This processing has the same effect to the soft metal thin film of copper and the like.

Next, mounting of the chip frame to the chip will be described with reference to FIG. 27. The chip frame 41 is adhered to the side face and the surface on the emitter side of the chip 1, and at this time, the corner of the lower portion of the inner side wall of the frame to be adhered is subjected to chamfering in about 0.2 mm. An adhesive 49 is applied to the contact plane of the chip frame 41 thereafter, and both of them are adhered. By such processing, exudation of the adhesive 49 to the pattern on the chip surface can be prevented.

Figure 28:
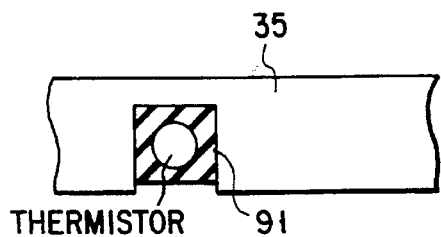
FIG. 28 is a plan view of a square shaped external frame of the semiconductor device of the present invention.

The external frame which integrally protects the collective body of the chip is a disk-like form, and is called a ring frame, but the present invention is not restricted to this shape. As shown in FIG. 28, there is a semiconductor device having a square shape, and in this case, also the external frame 29 becomes square. Since the chip collective body is almost square, it becomes more compact than the one having a circular shape.

Figure 29A:
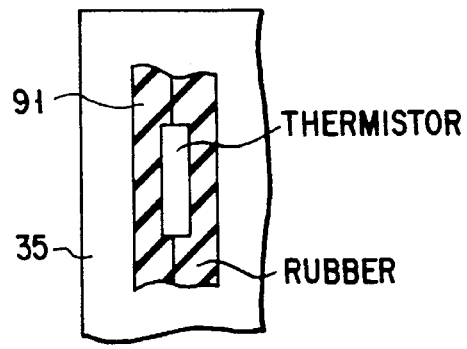
FIG. 29A is a first sectional view of a thermistor mounted to the trench of the electrode plate of the present invention.
Figure 29C:
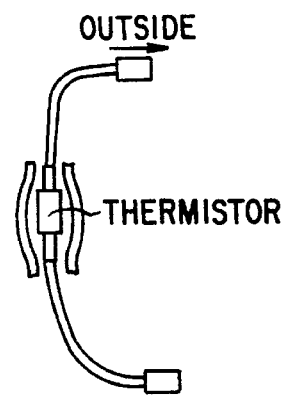
FIG. 29C is an example to mount the thermistor to the gate lead.
Figure 29B:
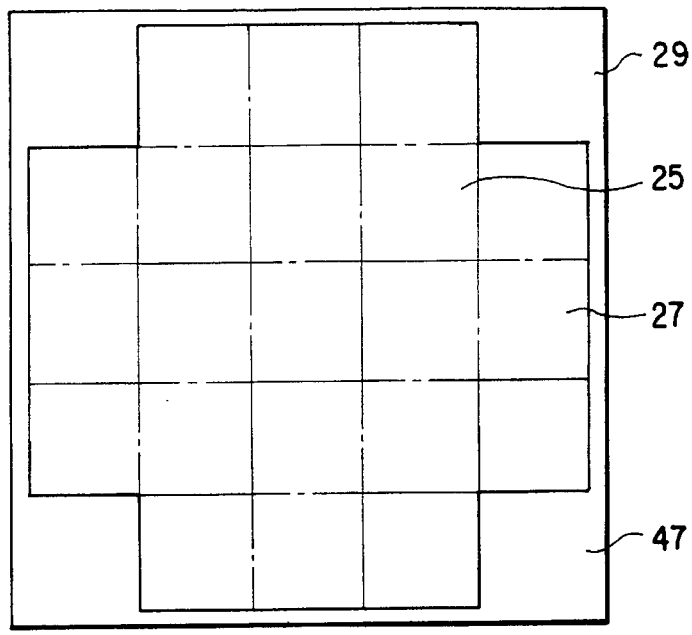
FIG. 29B is a second sectional view of a thermistor mounted to the trench of the electrode plate of the present invention.

FIGS. 29A, 29B and 29C show the method to attach a thermistor to the trench of the electrode plate for wiring the gate lead. The thermistor is used for detection of the temperature of the chip. When the electrode plate in FIG. 15 is used, an exclusive trench 91 (not shown in FIG. 15) is prepared, and when the electrode plate of FIG. 14 and FIG. 16 is used, the necessary trench is selected. In FIGS. 29A and 29B, a trench 91 for forming a circuit of the temperature detecting element (thermistor) is formed in the electrode plate 35, for example, shown in FIG. 15, and is fixed by a silicone rubber by embedding a thermistor.

As described above, the multi-chip press-contact type high speed power device in which various kinds of multiple chips of the present invention are arranged in high density has characteristics described below:

(1) It is facilitated to obtain high current capability of the device. And the high current capability of the device is obtained by the same chips.
(2) It is facilitated to obtain high functionality and high value-adding of the device. Combination of various chips becomes possible.

Furthermore, by making the semiconductor device press-contact type, high reliability which has been impossible in the conventional module type high speed power device is made possible as described below:

(1) Reliability for the power cycle and thermal fatigue by bondingless and soft solderless is improved. For example, in the semiconductor devices for traction applications, it becomes possible to be endurable to the power cycle of 6 million cycles, and to a temperature cycle against the thermal fatigue of 75,000 cycles.

(2) Cooling both faces becomes possible. The cooling capability becomes twice as that of the conventional one face cooling, and the outside diameter of the chip can be reduced to about half thereof. In the reverse conduction type IGBT of 1200 A–2500 V class, the outer diameter of the chip becomes 120 mm or smaller, which is about half of that of the module type IGBT.

(3) Reliability for high temperature and high voltage operations is improved. A ceramic package which has the actual performance in the press-contact type semiconductor for traction applications can be used.

(4) Wiring inductance is reduced. The inductance between chips can be suppressed to minimum by press contact.

The high speed power device having a planar high voltage structure which has been impossible to press-contact in the conventional press-contact structure is made possible by mounting a chip frame of synthetic resin at the chip periphery. Furthermore, by fixing the collective body of the chip by an external frame, various kinds of chips such as IGBT chips, FRD chips and the like can be collectively press-contacted. Moreover, difference at the time of collective press contact due to the difference of the chips and the thickness of members can be suppressed and uniform press contact is made possible by inserting a thickness adjusting plate of a soft metal sheet and making the thickness of the thermal buffer plate sufficiently thick. Furthermore, by forming trenches on the inner face of the emitter or collector electrode plate to be press-contacted, corresponding to the outer sizes of the chips, a bending force is prevented from being applied to the chip. Furthermore, by providing to the chip frame an extending portion which covers the contacting area of the gate electrode, it is facilitated to protect the contacting area and connect the gate lead to the contacting area.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A press-contact type semiconductor device comprising:
    multiple semiconductor substrates;
    a chip frame of insulating resin enclosing a periphery of each of the semiconductor substrates so as to increase the voltage rating of each of the semiconductor substrates, said chip frame being adhered to each of said semiconductor substrates so that each of the semiconductor substrates with the adhered chip frame can move as a unit;
    a first electrode plate; and
    a second electrode plate;
    wherein
    each of the semiconductor substrates is arranged on a same plane so as to abut against said chip frame and is press-contacted from upper and lower sides by said first electrode plate and said second electrode plate.

2. A press-contact type semiconductor device according to claim 1, wherein a trench is formed opposite to each of peripheral regions of said multiple semiconductor substrates, each of said peripheral regions being adhered to said chip frame, on the press-contact plane of at least one electrode plate of said first and second electrode plates.

3. A press-contact type semiconductor device according to claim 2, wherein a thickness-adjusting plate comprising a soft metal sheet is intervened so as to abut against the press-contact plane of at least one electrode plate of said first and second electrode plates.

4. A press-contact type semiconductor device according to claim 1, wherein a thermal buffer plate is intervened between at least one electrode plate of said first and second electrode plates and said semiconductor substrate.

5. A press-contact type semiconductor device according to claim 4, wherein a thickness-adjusting plate comprising a soft metal sheet is intervened between at least one electrode plate of said first and second electrode plates and said thermal buffer plate.

6. A press-contact type semiconductor device according to claim 4, wherein a trench is formed opposite to each of peripheral regions of said multiple semiconductor substrates, each of said peripheral regions being adhered to said chip frame, on the press-contact plane of at least one electrode plate of said first and second electrode plates.

7. A press-contact type semiconductor device according to claim 6, wherein a thickness-adjusting plate comprising a soft metal sheet is intervened between at least one electrode plate of said first and second electrode plates and said thermal buffer plate.

8. A press-contact type semiconductor device according to claim 1, further comprising an external frame of insulating resin mounted between said first electrode plate and said second electrode plate having a peripheral region enclosing side faces of said first and second electrode plates, and a projection inserted between said first and second electrode plates so as to project from an inner wall of said peripheral region and enclose the multiple semiconductor substrates adhered to the chip frames arranged on said same plane.

9. A press-contact type semiconductor device according to claim 8, wherein a trench is formed opposite to each of peripheral regions of said multiple semiconductor substrates, each of said peripheral regions being adhered to said chip frame, on the press-contact plane of at least one electrode plate of said first and second electrode plates.

10. A press-contact type semiconductor device according to claim 9, wherein a thickness-adjusting plate comprising a soft metal sheet is intervened so as to abut against the press-contact plane of at least one electrode plate of said first and second electrode plates.

11. A press-contact type semiconductor device according to claim 8, wherein a thermal buffer plate is intervened between at least one electrode plate of said first and second electrode plates and said semiconductor substrate.

12. A press-contact type semiconductor device according to claim 11, wherein a thickness-adjusting plate comprising a soft metal sheet is intervened between at least one electrode plate of said first and second electrode plates and said thermal buffer plate.

13. A press-contact type semiconductor device according to claim 11, wherein a trench is formed opposite to each of peripheral regions of said multiple semiconductor substrates, each of said peripheral regions being adhered to said chip frame, on the press-contact plane of at least one electrode plate of said first and second electrode plates.

14. A press-contact type semiconductor device according to claim 13, wherein a thickness-adjusting plate comprising a soft metal sheet is intervened between at least one electrode plate of said first and second electrode plates and said thermal buffer plate.

15. A press-contact type semiconductor device according to claim 8, wherein a contacting area of the electrode is formed on a surface of each of the semiconductor substrates, and said chip frame has an extending portion extending along the surface of said semiconductor substrate into an inside of a chip, said extending portion covering the contacting area of said electrode.

16. A press-contact type semiconductor device according to claim 15, wherein a trench is formed opposite to each of peripheral regions of said multiple semiconductor substrates, each of said peripheral regions being adhered to said chip frame, on the press-contact plane of at least one electrode plate of said first and second electrode plates.

17. A press-contact type semiconductor device according to claim 16, wherein a thickness-adjusting plate comprising a soft metal sheet is intervened so as to abut against the press-contact plane of at least one electrode plate of said first and second electrode plates.

18. A press-contact type semiconductor device according to claim 15, wherein a thermal buffer plate is intervened between at least one electrode plate of said first and second electrode plates and said semiconductor substrate.

19. A press-contact type semiconductor device according to claim 18, wherein a thickness-adjusting plate comprising a soft metal sheet is intervened between at least one electrode plate of said first and second electrode plates and said thermal buffer plate.

20. A press-contact type semiconductor device according to claim 18, wherein a trench is formed opposite to each of peripheral regions of said multiple semiconductor substrates, each of said peripheral regions being adhered to said chip frame, on the press-contact plane of at least one electrode plate of said first and second electrode plates.

21. A press-contact type semiconductor device according to claim 20, wherein a thickness-adjusting plate comprising a soft metal sheet is intervened between at least one electrode plate of said first and second electrode plates and said thermal buffer plate.

* * * * *